(12) United States Patent
Luo et al.

(10) Patent No.: US 12,547,081 B2
(45) Date of Patent: Feb. 10, 2026

(54) ILLUMINATION COMPENSATION METHOD

(71) Applicant: THE INSTITUTE OF OPTICS AND ELECTRONICS, THE CHINESE ACADEMY OF SCIENCES, Sichuan (CN)

(72) Inventors: Xiangang Luo, Sichuan (CN); Yanqin Wang, Sichuan (CN); Weijie Kong, Sichuan (CN); Changtao Wang, Sichuan (CN); Ge Yin, Sichuan (CN); Yan Tang, Sichuan (CN); Yu He, Sichuan (CN); Chengwei Zhao, Sichuan (CN); Zeyu Zhao, Sichuan (CN)

(73) Assignee: THE INSTITUTE OF OPTICS AND ELECTRONICS, THE CHINESE ACADEMY OF SCIENCES, Chengdu (CN)

( * ) Notice: Subject to any disclaimer, the term of this patent is extended or adjusted under 35 U.S.C. 154(b) by 0 days.

(21) Appl. No.: 19/252,028

(22) Filed: Jun. 27, 2025

(65) Prior Publication Data

US 2025/0321494 A1     Oct. 16, 2025

Related U.S. Application Data

(63) Continuation-in-part of application No. PCT/CN2022/142749, filed on Dec. 28, 2022.

(51) Int. Cl.
*G03F 7/00* (2006.01)
*G01B 11/14* (2006.01)

(52) U.S. Cl.
CPC .......... *G03F 7/70141* (2013.01); *G01B 11/14* (2013.01); *G03F 7/70625* (2013.01); *G03F 7/706837* (2023.05); *G03F 7/706839* (2023.05)

(58) Field of Classification Search
CPC ............ G03F 7/70141; G03F 7/70625; G03F 7/706837; G03F 7/706839; G01B 11/14
See application file for complete search history.

(56) References Cited

U.S. PATENT DOCUMENTS

| 5,652,645 A | 7/1997 | Jain |
| 7,559,047 B2 * | 7/2009 | Miyamoto .......... G03F 7/70625 382/144 |

(Continued)

FOREIGN PATENT DOCUMENTS

| CN | 107885038 A | 4/2018 |
| CN | 109657402 A | 4/2019 |

(Continued)

OTHER PUBLICATIONS

Changtao Wang et al., Surface Plasmon Lithography Beyond the Diffraction Limit, Chinese Science Bulletin, Feb. 29, 2016, pp. 585-599, vol. 61, No. 06.

(Continued)

*Primary Examiner* — Hung V Nguyen

(57) ABSTRACT

An illumination compensation method, comprising: acquiring working gaps between an imaging film stack and a mask in an exposure imaging system; calculating imaging light field intensities of a photoresist layer in the imaging film stack corresponding to the different working gaps, and, constructing a functional dependence of imaged pattern critical dimension in the photoresist layer of the imaging film stack on the working gap based on said imaging light field intensity critical dimension; calculating compensation parameters required for illumination light according to the said functional dependence of imaged pattern critical dimension on working gap; and, performing illumination compensation on the exposure imaging system according to the compensation parameters.

7 Claims, 21 Drawing Sheets

(56) References Cited

U.S. PATENT DOCUMENTS

| | | | |
|---|---|---|---|
| 10,365,566 B2* | 7/2019 | Clube | ................. G03F 7/7035 |
| 2011/0305994 A1 | 12/2011 | Montelius | |
| 2014/0168621 A1 | 6/2014 | Li et al. | |
| 2020/0225513 A1 | 7/2020 | Song et al. | |
| 2021/0318251 A1 | 10/2021 | Lu et al. | |

FOREIGN PATENT DOCUMENTS

| | | | |
|---|---|---|---|
| CN | 113495073 A | 10/2021 | |
| JP | 2001358073 A | 12/2001 | |
| JP | 2005175042 A | 6/2005 | |
| JP | 2013097310 A | 5/2013 | |
| JP | 2016218381 A | 12/2016 | |
| WO | 2012067246 A1 | 5/2012 | |
| WO | 2013105317 A1 | 7/2013 | |

OTHER PUBLICATIONS

International Search Report of PCT Patent Application No. PCT/CN2022/142749 issued on Sep. 24, 2023.
Written Opinion of PCT Patent Application No. PCT/CN2022/142749 issued on Sep. 24, 2023.
Office Action of corresponding Japanese application No. 2025-538768 issued on Nov. 18, 2025.

* cited by examiner

ILLUMINATION COMPENSATION METHOD

CROSS REFERENCE TO RELATED APPLICATIONS

The present application is a Continuation-In-Part Application of PCT Application No. PCT/CN2022/142749 filed on Dec. 28, 2022, the contents of which are incorporated herein by reference in their entirety.

TECHNICAL FIELD

The present disclosure relates to the technical field of resolution enhancement techniques in integrated circuit manufacturing, and particularly relates to an illumination compensation method.

BACKGROUND ART

During the exposure process, incident light waves emitted by the illumination light source pass through the illumination system, impinge on the mask in a normal or oblique incidence manner through the mask substrate, and interact with the mask. The evanescent waves carrying sub-wavelength information of the mask pattern undergo photochemical reaction with the photoresist layer spin-coated on the substrate. After the development of the photoresist, an image of the mask pattern is formed. The gap between the mask and the imaging film stack containing the photoresist is referred to as the working gap. The light field intensity within the photoresist layer is relatively sensitive to changes in the working gap. When the working gap changes, the light field intensity within the photoresist layer changes, and the critical dimension of the imaged patterns also changes. Ideally, when the pattern on the mask is a uniformly distributed pattern of the same critical dimension, the light field intensity within the photoresist layer and the imaged pattern both exhibit uniform spatial distribution with consistent critical dimensions.

However, during the actual exposure process, the working gap at each location is not the same, causing the light field intensity distribution within the photoresist layer to be non-uniform, but to change with the working gap undulation, ultimately resulting in the imaged pattern also becoming a distribution of non-uniform critical dimension. The differences in the working gap may be caused by various reasons, such as undulation of the surface topography of the imaging film stack substrate, inconsistent thickness of the processed imaging film stack, or inconsistent height of the mask pattern. For example, the surface of the imaging film stack substrate is not absolutely flat and often has undulations. Because the imaging film stack is very thin, after coating the imaging film stack substrate, the low-frequency undulation of the surface of the imaging film stack cannot be improved. Such undulation reduces or increases the working gap, causing the light field intensity within the photoresist layer to no longer be uniformly distributed, but to change with the undulation, ultimately resulting in the imaged pattern also becoming a non-uniform distribution, thereby seriously affecting the exposure result or even causing exposure failure.

SUMMARY

To address the above technical problem, the present disclosure provides an illumination compensation method, for at least partially solving the technical problem in the prior art that non-uniform working gaps cause non-uniformity of imaged patterns, which seriously affects the exposure result.

Based on this, the present disclosure provides an illumination compensation method, comprising: acquiring working gaps between an imaging film stack and a mask in an exposure imaging system; calculating the imaging light field intensity of the photoresist layer in the imaging film stack corresponding to different working gaps; constructing a functional dependence of imaged pattern critical dimension in the photoresist layer of the imaging film stack on the working gap based on said imaging light field intensity; calculating compensation parameters required for illumination light according to the said functional dependence of imaged pattern critical dimension on working gap; and performing illumination compensation on the exposure imaging system according to the compensation parameters.

According to the embodiment of the present disclosure, the step of acquiring the working gap between the imaging film stack and the mask in the exposure imaging system specifically includes: measuring undulation profile of the surface of the imaging film stack; and determining the working gap between the imaging film stack and the mask according to the undulation profile.

According to the embodiment of the present disclosure, the step of calculating the imaging light field intensity of the photoresist layer in the imaging film stack corresponding to different working gaps specifically includes: establishing an optical simulation model from the illumination light to the imaging light field in the photoresist layer, wherein the optical simulation model comprises a projection lens group simulation model modeling light propagation from the illumination light to the incident light on the upper surface of the mask, and an imaging film stack optical simulation model modeling light propagation from the on the upper surface of the mask to the imaging light field in the photoresist layer; and calculating the imaging light field intensity of the photoresist layer corresponding to varied working gaps under given mask patterns and illumination light distribution based on the optical simulation model.

According to the embodiment of the present disclosure, the optical simulation model is:

$$I_{Pr}(x, y) = I_{ill}(x, y) \otimes PSF_{lens} \otimes \text{Mask}(x, y) \otimes PSF_{near-field},$$

where $I_{Pr}(x,y)$ is the imaging light field intensity distribution in the photoresist layer, $I_{ill}(x,y)$ is the corresponding parameter distribution of the illumination light, $PSF_{lens}$ and $PSF_{near-filed}$ are the optical point spread functions of the projection lens group simulation model and the imaging film stack optical simulation model respectively, and Mask(x,y) is the mask pattern distribution.

According to the embodiment of the present disclosure, the optical simulation model is constructed using a finite-difference time-domain (FDTD) method, a rigorous coupled wave analysis (RCWA) method, or a finite element method (FEM).

According to the embodiment of the present disclosure, the step of constructing a functional dependence of imaged pattern critical dimension in the photoresist layer of the imaging film stack on the working gap based on said imaging light field intensity specifically includes: applying a threshold to the imaging light field intensity of the photoresist layer corresponding to each working gap, to obtain the critical dimension of the imaged pattern of the photoresist layer corresponding to the working gap; and constructing the relationship between the critical dimension of the imaged pattern of the photoresist layer and the working gap based on a critical dimension of the imaged pattern corresponding to each working gap.

According to the embodiment of the present disclosure, the step of calculating compensation parameters required for illumination light according to the said functional dependence of imaged pattern critical dimension on working gap specifically includes: according to the relationship between the original critical dimension of the imaged pattern and the working gap, and the relationship between the expected critical dimension of the imaged pattern and the working gap, calculating the critical dimension of the imaged pattern of the photoresist layer that needs to be compensated under different working gaps; and converting the critical dimension of the imaged pattern of the photoresist layer that needs to be compensated into corresponding imaging light field intensity, substituting the corresponding imaging light field intensity into the optical simulation model, and calculating compensation parameters, wherein the compensation parameters include light intensity, polarization state, and phase.

According to the embodiment of the present disclosure, the step of performing illumination compensation on the exposure imaging system according to the compensation parameters specifically includes: constructing an illumination compensation system using light field modulation technology according to the compensation parameters; and performing pixelation adjustment on the incident light field of the exposure imaging system using the illumination compensation system.

According to the embodiment of the present disclosure, the illumination compensation method further includes: respectively calculating the uniformity evaluation index of the critical dimension of the imaged pattern of the photoresist layer before and after illumination compensation; determining whether the uniformity evaluation index of the critical dimension of the imaged pattern of the photoresist layer after compensation is superior to the uniformity evaluation index of critical dimension of the imaged pattern of the photoresist layer before compensation; and determining that the illumination compensation is effective when the uniformity evaluation index after compensation is superior to the uniformity evaluation index before compensation.

According to the embodiment of the present disclosure, the step of calculating the uniformity evaluation index of the critical dimension of the imaged pattern of the photoresist layer specifically includes: determining the central working gap; and taking the uniformity values of the critical dimension of the imaged pattern of the photoresist layer when the working gap varies around the central working gap as the uniformity evaluation index.

According to the illumination compensation method provided in the embodiment of the present disclosure, at least the following beneficial effects are included.

According to the distribution of the working gap, the imaging light field intensity corresponding to different working gaps is calculated; based on the imaging light field intensity, the relationship between the critical dimension of the imaged pattern and the working gap is determined; compensation parameters required for illumination light can be calculated, and further, the light intensity, polarization state, phase and other parameters of the incident light at different positions can be performed with pixelation adjustment according to the compensation parameters, so that the imaging light field in the photoresist layer at different working gaps tends to be consistent, thereby improving the uniformity of the critical dimension of the imaged pattern over a large area, and meeting the critical dimension uniformity (CDU) requirement.

Furthermore, by constructing the optical simulation model, the compensation parameters of light intensity, polarization state, and phase for the incident light at different positions can be accurately calculated, thereby improving the accuracy of illumination compensation, and further ensuring the uniformity of the critical dimension of the imaged pattern.

Further, according to the compensation parameters, the illumination compensation system is constructed using light field modulation technology to perform pixelation adjustment on the illumination light field, so that the illumination compensation method is easy to implement through the modulator, thereby improving the convenience of illumination compensation.

In addition, since the light intensity, polarization state, and phase of the incident light change, the critical dimension of the imaged pattern also changes. Therefore, the illumination compensation method can not only be applied to exposure with different working gaps to increase the uniformity of the imaged critical dimension and improve the imaging quality of the mask pattern, but also realize clear imaging of mask patterns with different critical dimensions through the illumination compensation technology.

BRIEF DESCRIPTION OF DRAWINGS

Through the following description of the embodiments of the present disclosure with reference to the drawings, the above and other objects, features, and advantages of the present disclosure will become more apparent. In the drawings.

REFERENCE NUMERALS

Figure 1:
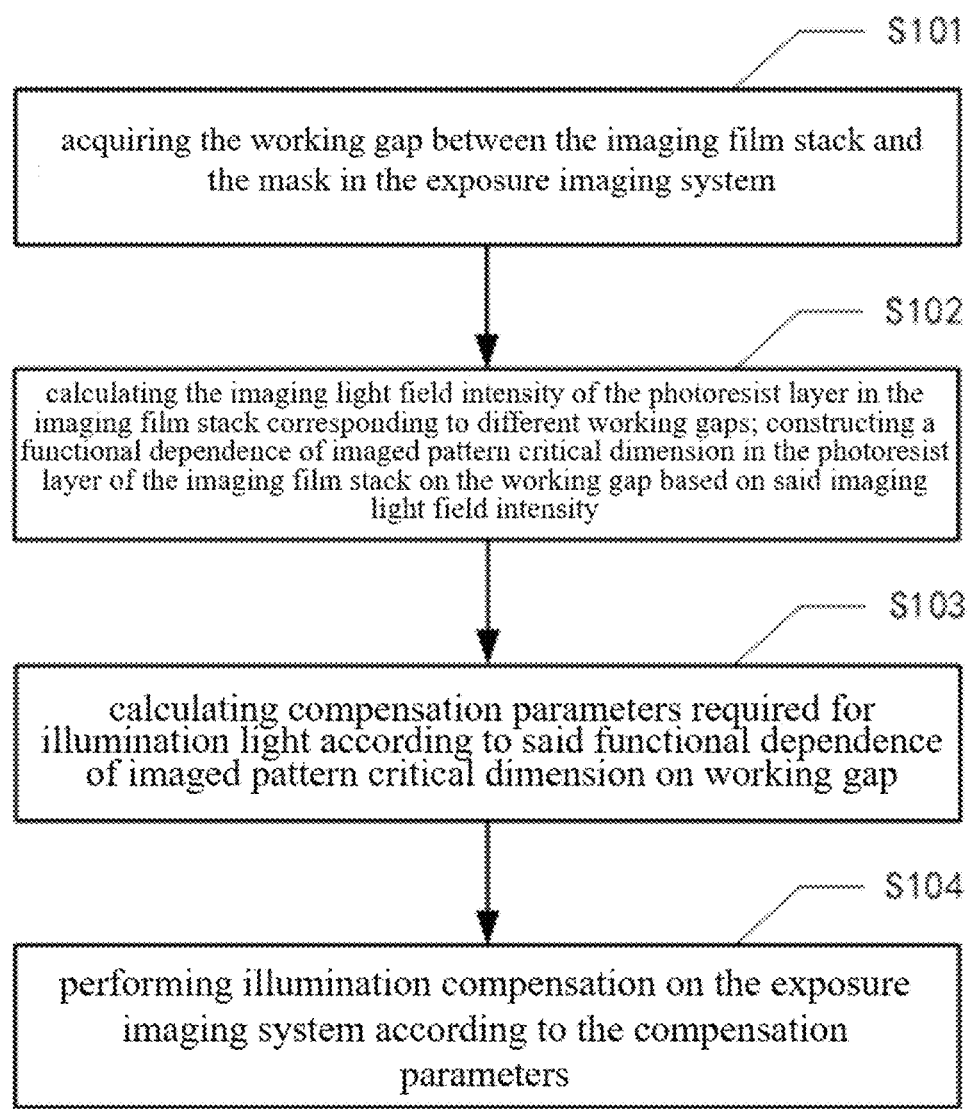
FIG. 1 schematically shows a flowchart of an illumination compensation method provided in one embodiment of the present disclosure.

1—mask, 11—mask substrate, 12—mask pattern layer, 2—imaging film stack, 21—metal absorber layer, 22—photoresist layer, 23—metal reflective layer, 24—imaging film stack substrate, 3—light modulator, 4—coupling lens group.

DETAILED DESCRIPTION OF EMBODIMENTS

In order to make the objectives, technical solutions, and advantages of the present disclosure clearer and more understandable, the present disclosure is described in further detail hereinafter in connection with specific embodiments and with reference to the drawings. Obviously, the described embodiments are part of the embodiments of the present disclosure, rather than all of the embodiments. Based on the embodiments of the present disclosure, all other embodiments obtained by those skilled in the art without paying inventive effort shall fall within the protection scope of the present disclosure.

The terminology used herein is only for describing specific embodiments and is not intended to limit the present disclosure. The terms "comprise", "include", and the like as used herein indicate the presence of the described features, steps, operations, and/or components, but do not preclude the presence or addition of one or more other features, steps, operations, or components.

In the present disclosure, unless otherwise expressly specified and defined, the terms "mount", "connect", "link", "fix", and the like should be understood broadly, for example, they may be fixed connection, or detachable connection, or integrated; they may be a mechanical connection, or electrical connection or capable of communication with each other; they may be a direct connection, or indirectly connected through an intermediate medium; they may be communication within two elements or interaction relationship between two elements. Those of ordinary skill in the art can understand the specific meanings of the above terms in the present disclosure according to specific situations.

In the description of the present disclosure, it should be understood that the terms "longitudinal", "length", "circumferential", "front", "rear", "left", "right", "top", "bottom", "inner", "outer", and other terms indicating orientations or positional relationships are based on the orientations or positional relationships shown in the drawings. These terms are only for the purpose of describing the present disclosure and simplifying the description, rather than indicating or implying that the referred subsystems or components must have a specific orientation, be constructed and operated in a specific orientation. Therefore, these terms above cannot be understood as limitations to the present disclosure.

Throughout the drawings, identical elements are represented by the same or similar reference numerals. When the conventional structures or configurations may lead to confusion in the understanding of the present disclosure, they will be omitted. The shape, size, and positional relationship of each component in the figures do not reflect the actual size, proportion, and actual positional relationship. In addition, in the claims, any reference signs placed between parentheses shall not be construed as limiting the claims.

Similarly, in order to streamline the present disclosure and help the understanding of one or more aspects disclosed, in the above description of the exemplary embodiments of the present disclosure, various features of the present disclosure are sometimes grouped together in a single embodiment, drawing, or in its description. The reference to the terms "an embodiment", "some embodiments", "example", "specific example", or "some examples", and the like means that the specific features, structures, materials, or characteristics described in connection with the embodiment or example are included in at least one embodiment or example of the present disclosure. The indicative expressions of the above terms in this specification do not necessarily refer to the same embodiment or example. Moreover, the specific features, structures, materials, or characteristics described can be combined in a suitable manner in any one or more embodiments or examples.

Additionally, the terms "first" and "second" are used for descriptive objectives only and should not be understood as indicating or implying relative importance or specifying the quantity of the indicated technical features. Therefore, features limited by "first", or "second" may explicitly or implicitly include one or more of such features. In the description of the present disclosure, the meaning of "plurality" is at least two, such as two and three, unless explicitly and specifically limited otherwise.

The objective of the present disclosure is to provide an illumination compensation method, by changing parameters such as light intensity, polarization, and phase of incident light at different positions, to adjust the imaging light field distribution within the photoresist layer at different positions, so that the critical dimension uniformity (CDU) is improved, thereby enhancing the uniformity of large-area exposure results. The illumination compensation method will be described in detail below in conjunction with the drawings and specific embodiments.

FIG. 1 schematically shows a flowchart of an illumination compensation method provided in one embodiment of the present disclosure.

As shown in FIG. 1, the illumination compensation method may include, for example, operations S101 to S104.

Operation S101: acquiring the working gap between the imaging film stack and the mask in the exposure imaging system.

Operation S102: calculating the imaging light field intensity of the photoresist layer in the imaging film stack corresponding to different working gaps; constructing a functional dependence of imaged pattern critical dimension in the photoresist layer of the imaging film stack on the working gap based on said imaging light field intensity.

Operation S103: calculating compensation parameters required for illumination light according to said functional dependence of imaged pattern critical dimension on working gap.

Operation S104: performing illumination compensation on the exposure imaging system according to the compensation parameters.

According to the illumination compensation method provided in the embodiment of the present disclosure, by measuring the working gap, the imaging light field intensity distribution and corresponding pattern critical dimension in the photoresist layer under different working gaps are calculated. With the objective of improving the critical dimension uniformity of the critical dimension of the imaged pattern of the photoresist, inverse optimized calculation is performed to obtain the required compensation parameter distribution (e.g., light intensity, polarization, phase) of the incident light. Subsequently, the incident light field is performed with pixelation adjustment to improve the uniformity of the critical dimension of the imaged pattern of the photoresist.

Figure 2:
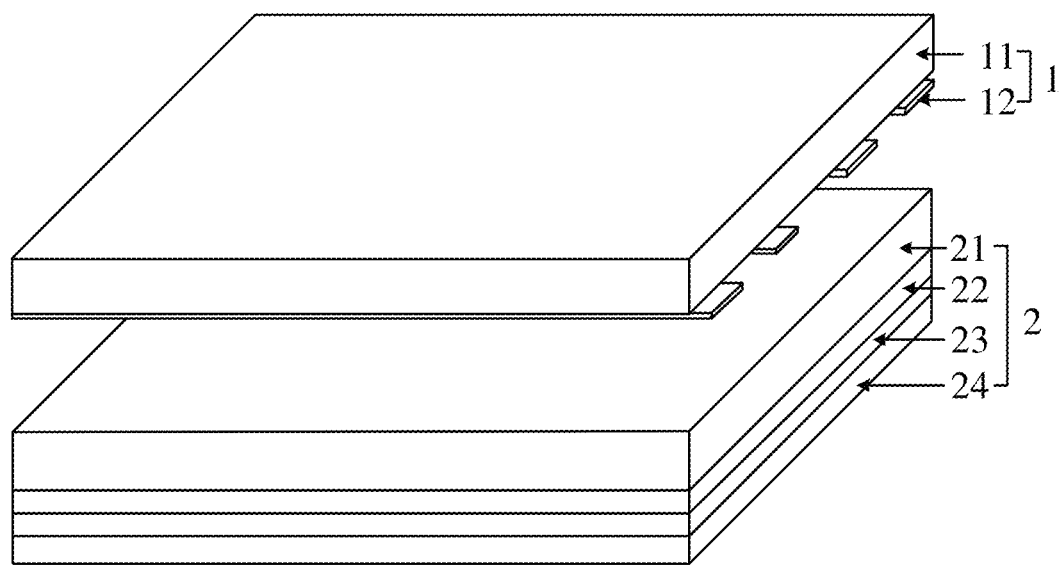
FIG. 2 schematically shows a structural diagram of an exposure imaging system provided in the embodiment of the present disclosure.

FIG. 2 schematically shows a structural diagram of an exposure imaging system provided in the embodiment of the present disclosure.

As shown in FIG. 2, the exposure imaging system includes the mask 1 and the imaging film stack 2. The mask 1 includes the mask substrate 11 and the mask pattern layer 12, and the imaging film stack 2 includes the metal absorber layer 21, the photoresist layer 22, the metal reflective layer 23, and the imaging film stack substrate 24. The mask substrate 11 can be, for example, a silicon substrate or a silicon dioxide substrate. The mask pattern layer 12 can be made of Cr. The metal absorber layer 21 and metal reflective layer 23 can be, for example, made of Ag, Au, Cu, etc. The photoresist layer 22 can be, for example, made of Pr or similar materials. The imaging film stack substrate 24 can be, for example, a silicon substrate, a silicon dioxide substrate, a silicon substrate with an anti-reflective layer, or a silicon dioxide substrate with an anti-reflective layer, among other base structures.

The illumination light transmits through the mask substrate 11 to impinge on the mask pattern layer 12 in a normal incidence or oblique incidence manner, and interacts with the mask pattern layer 12. The evanescent waves carrying sub-wavelength information of the mask pattern undergo a photochemical reaction with the photoresist layer 22. After the development of the photoresist layer 22, an image of the mask pattern is formed.

In the embodiment of the present disclosure, device such as an interferometer can be used to measure the undulation profile of the surface of the imaging film stack 2 in the exposure imaging system, and the working gap between the mask 1 and imaging film stack 2 is obtained from the undulation profile. Further, when the undulation of the surface of the mask 1 and the undulation of the surface of the imaging film stack 2 have little influence on the working gap, the undulation profile of the surface of the imaging film stack substrate 24 can be measured using an interferometer or other device. Then, the working gap can then be calculated based on the undulation profile. Afterward, the other layers of the exposure imaging system can be prepared sequentially on the imaging film stack substrate by spin coating, sputtering, or other methods. A specific working gap can be designated as the reference working gap value, with other working gaps fluctuating around this reference.

Figure 3:
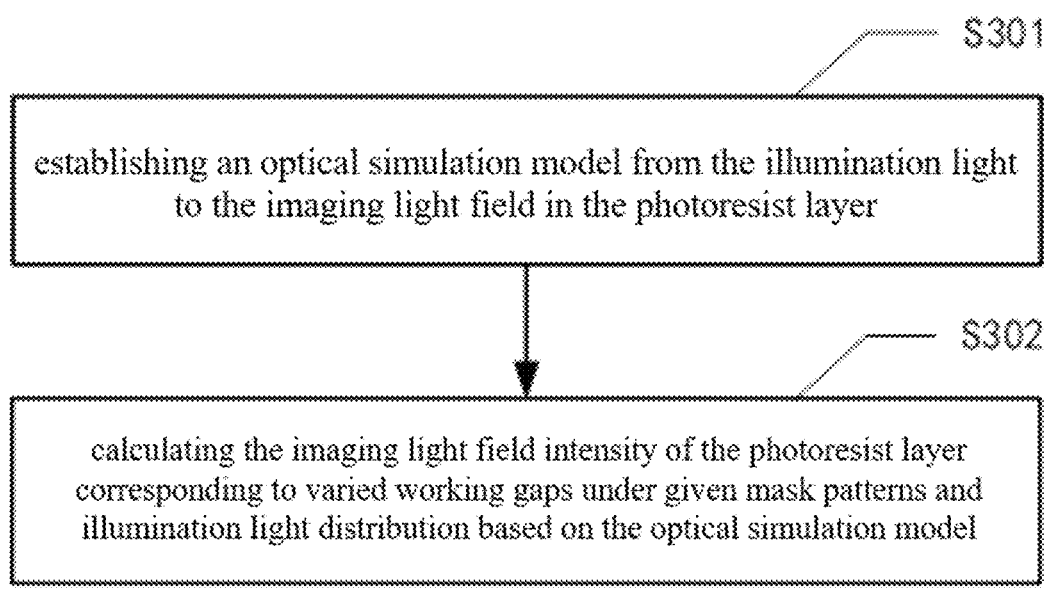
FIG. 3 schematically shows a flowchart of a method for calculating an imaging light field intensity in operation S102 provided in the embodiment of the present disclosure.

FIG. 3 schematically shows a flowchart of a method for calculating an imaging light field intensity in operation S102 provided in the embodiment of the present disclosure.

As shown in FIG. 3, the method for calculating an imaging light field intensity can include, for example, operations S301 to S302.

Operation S301: establishing an optical simulation model from the illumination light to the imaging light field in the photoresist layer.

Operation S302: calculating the imaging light field intensity of the photoresist layer corresponding to varied working gaps under given mask patterns and illumination light distribution based on the optical simulation model.

In the embodiment of the present disclosure, the optical simulation model includes a projection lens group simulation model modeling light propagation from the illumination light to the incident light on the upper surface of the mask, and an imaging film stack optical simulation model modeling light propagation from the incident light on the upper surface of the mask to the imaging light field within the photoresist. Factors such as illumination mode, lens group, mask, working gap, imaging film stack structure, and substrate are all taken into account. The optical simulation model can be constructed using methods such as the finite-difference time-domain (FDTD) method, the rigorous coupled wave analysis (RCWA) method, or the finite element method (FEM).

Further, the optical simulation model is:

$$I_{Pr}(x, y) = I_{ill}(x, y) \otimes PSF_{lens} \otimes \text{Mask}(x, y) \otimes PSF_{near-field},$$

where $I_{Pr}(x,y)$ is the imaging light field intensity distribution in the photoresist layer, $I_{ill}(x,y)$ is the corresponding parameter distribution of the illumination light, such as light intensity, $PSF_{lens}$ and $PSF_{near-filed}$ are the optical point spread functions of the projection lens group simulation model and the imaging film stack optical simulation model respectively, and $\text{Mask}(x,y)$ is the mask pattern distribution.

Given the mask pattern and the illumination light distribution, $\text{Mask}(x,y)$ and $I_{ill}(x,y)$ are known. Based on the established optical simulation model, the optical point spread functions $PSF_{lens}$ and $PSF_{near\text{-}filed}$ are also known. Therefore, the imaging light field intensity within the photoresist layer corresponding to different working gaps can be calculated.

Based on the optical simulation model, the corresponding illumination distribution for simulating a specific imaging light field distribution in the photoresist can also be determined.

In addition, the illumination mode adopted for constructing the optical simulation model is the illumination mode used in the actual exposure; the mask substrate used in the simulation model is the mask substrate used in actual exposure; the mask used in the simulation model is the mask used in actual exposure; and the distribution of the working gap adopted in the simulation model is the value of the working gap measured during actual exposure.

After obtaining the imaging light field intensity distribution in the photoresist layer, the relationship between the critical dimension of the imaged pattern and the working gap can be established.

Figure 4:
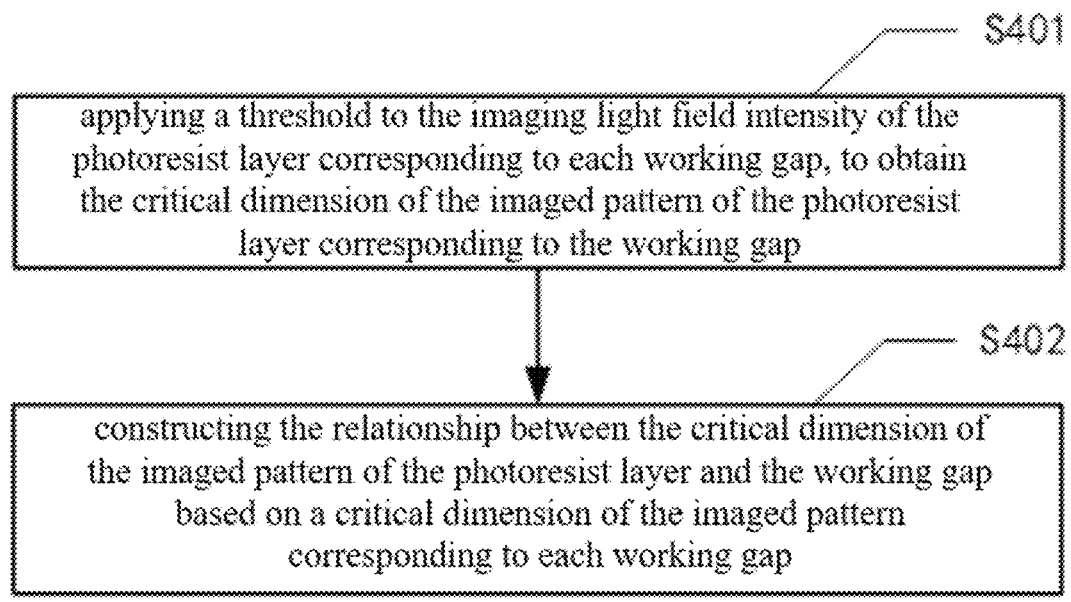
FIG. 4 schematically shows a flowchart of a method for constructing a relationship between a critical dimension of an imaged pattern and the working gap in operation S102 provided in the embodiment of the present disclosure.

FIG. 4 schematically shows a flowchart of a method for constructing a relationship between a critical dimension of an imaged pattern and the working gap in operation S102 provided in the embodiment of the present disclosure.

As shown in FIG. 4, the construction method can include, for example, operations S401 to S402.

Operation S401: applying a threshold to the imaging light field intensity of the photoresist layer corresponding to each working gap, to obtain the critical dimension of the imaged pattern of the photoresist layer corresponding to the working gap.

Operation S402: constructing the relationship between the critical dimension of the imaged pattern of the photoresist layer and the working gap based on a critical dimension of the imaged pattern corresponding to each working gap.

For example, the critical dimension of the imaged pattern of the photoresist layer can be determined by applying a threshold to the imaging light field intensity in the photoresist layer, i.e., Contour(x,y)=T $(I_{Pr}(x,y))$, where Contour (x,y) is the critical dimension of the imaged pattern of the photoresist, and T is the thresholding function.

After constructing the relationship between the critical dimension of the imaged pattern and the working gap, the required distribution of compensation parameters for the incident light can be calculated using the established optical simulation model.

Figure 5:
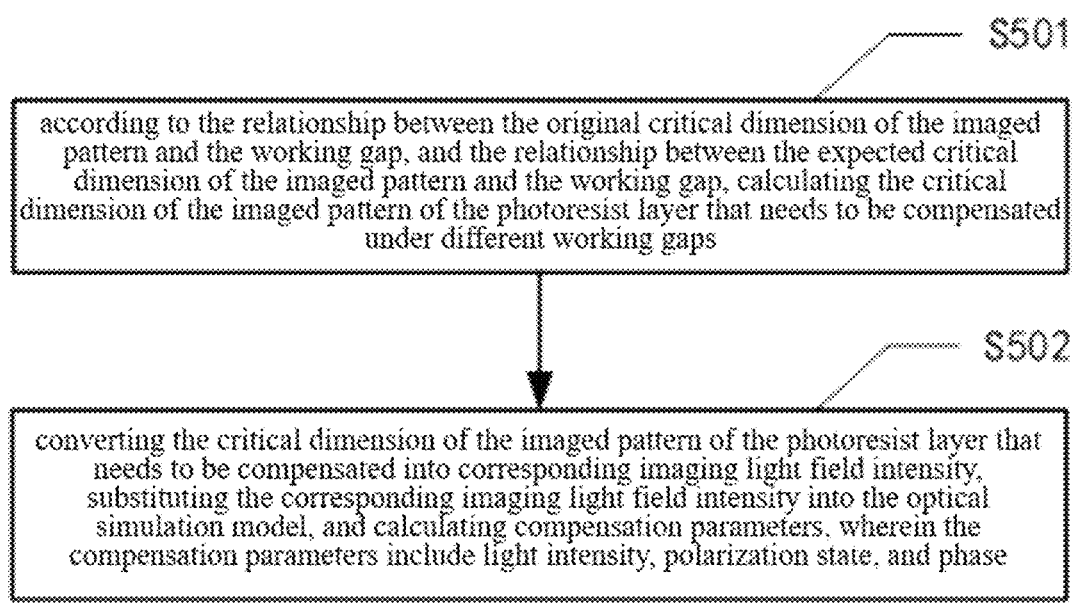
FIG. 5 schematically shows a flowchart of a method for calculating compensation parameters required for illumination light in operation S103 provided in the embodiment of the present disclosure.

FIG. 5 schematically shows a flowchart of a method for calculating compensation parameters required for illumination light in operation S103 provided in the embodiment of the present disclosure.

As shown in FIG. 5, the calculation method can include, for example, operations S501 to S502.

Operation S501: according to the relationship between the original critical dimension of the imaged pattern and the working gap, and the relationship between the expected critical dimension of the imaged pattern and the working gap, calculating the critical dimension of the imaged pattern of the photoresist layer that needs to be compensated under different working gaps.

Operation S502: converting the critical dimension of the imaged pattern of the photoresist layer that needs to be compensated into corresponding imaging light field intensity, substituting the corresponding imaging light field intensity into the optical simulation model, and calculating compensation parameters, wherein the compensation parameters include light intensity, polarization state, and phase.

As described above, applying a threshold of the imaging light field intensity can obtain the critical dimension of the imaged pattern of the photoresist layer. Conversely, the required compensated critical dimension of the imaged pattern of the photoresist layer can be converted into imaging light field intensity, and the intensity then substituted into the optical simulation model to calculate the compensation parameters, where the compensation parameters can include light intensity, polarization, and phase.

After calculating the compensation parameters, illumination compensation can be performed.

In the embodiment of the present disclosure, the step of performing illumination compensation on the exposure imaging system according to the compensation parameters specifically includes: constructing an illumination compensation system using light field modulation technology according to the compensation parameters; and performing pixelation adjustment on the incident light field of the exposure imaging system using the illumination compensation system.

Figure 6:
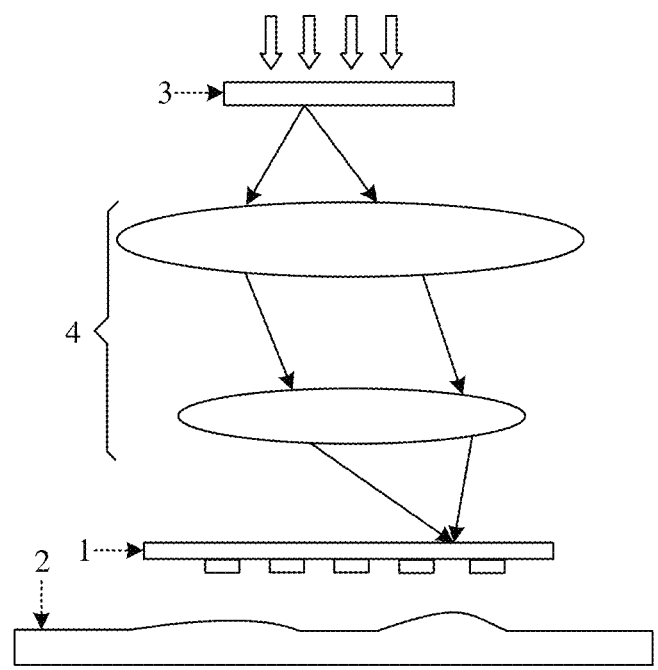
FIG. 6 schematically shows a structural diagram of an illumination compensation system provided in the embodiment of the present disclosure.

FIG. 6 schematically shows a structural diagram of an illumination compensation system provided in the embodiment of the present disclosure.

The constructed illumination compensation system can include, for example, a light modulator 3 and a coupling lens group 4. The light modulator 3 adjusts the distribution of the compensation parameters of the incident light according to the calculated compensation parameters. The modulated light is then incident to the designated location on the mask via the coupling lens group 4 to achieve illumination compensation with required light modulation depth, modulation range, and modulation precision for the illumination compensation information. Therefore, the illumination compensation enables the uniformity critical dimension of large-area exposure patterns when the topographic variations of a substrate of the photoresist exists.

The light modulator can include, for example, digital micromirror devices (DMDs), spatial light modulators (SLMs), or other modulators.

After performing illumination compensation through the constructed illumination compensation system, the effect of the illumination compensation can also be evaluated.

Figure 7:
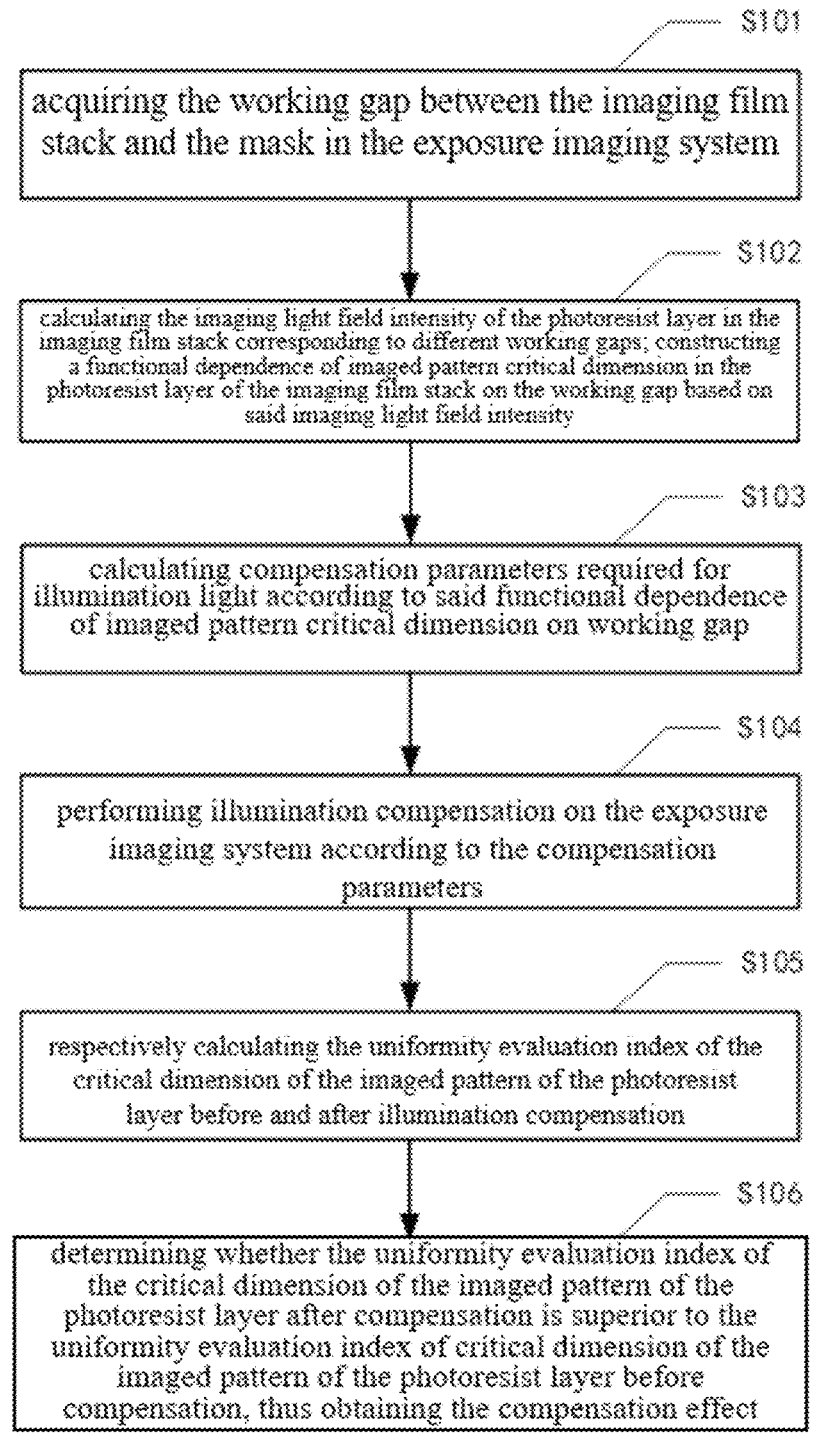
FIG. 7 schematically shows a flowchart of an illumination compensation method provided in another embodiment of the present disclosure.

FIG. 7 schematically shows a flowchart of an illumination compensation method provided in another embodiment of the present disclosure.

As shown in FIG. 7, after operation S104, the illumination compensation method can further include operations S105~S106.

Operation S105: respectively calculating the uniformity evaluation index of the critical dimension of the imaged pattern of the photoresist layer before and after illumination compensation.

Operation S106: determining whether the uniformity evaluation index of the critical dimension of the imaged pattern of the photoresist layer after compensation is superior to the uniformity evaluation index of critical dimension of the imaged pattern of the photoresist layer before compensation, thus obtaining the compensation effect.

Exemplarily, the central working gap can first be determined; and the critical dimension uniformity (CDU) value of the critical dimension of the imaged pattern of the photoresist layer can be taken as the uniformity evaluation index when the working gap varies around the central working gap. The CDU value is the percentage ratio of the difference between the maximum critical dimension of the imaged pattern and the critical dimension of the imaged pattern under the central working gap to the critical dimension of the imaged pattern under the central working gap when the working gap deviates from the central working gap, expressed as a percentage. When multiple deviating working gaps are considered, the CDU value is the average of the CDU values at these working gaps. The smaller the CDU value is, the better the uniformity of the imaged pattern is, the more excellent the uniformity performance is, and the less susceptible it is to the influence of the deviation of the working gap from the central working gap, that is, the larger the process window of exposure is. The critical dimension of the imaged pattern is determined according to the distribution of the imaging light field intensity. After the central working gap is selected, the deviation magnitude of the working gap from the central working gap can be determined according to the exposure system, and is generally 10% to 25% of the central working gap. The present disclosure is also applicable to using other parameters as evaluation indexes.

Before illumination compensation, according to the distribution curve of imaging light field intensity under different working gaps, a variation curve of the critical dimension of the imaged pattern in the photoresist layer with the working gap is calculated, and the CDU value before illumination compensation is calculated according to the variation curve.

After illumination compensation, a variation curve of the critical dimension of the pattern of the photoresist layer with the working gap is calculated, and the CDU value after illumination compensation is determined according to the curve. The CDU value before illumination compensation in step S102 is compared with the CDU value after illumination compensation in this step. When the CDU value after illumination compensation is smaller than the CDU value before illumination compensation, it is considered that the illumination compensation can have the effect of improving the uniformity of the imaging critical dimension.

It should be noted that the illumination compensation method provided in the embodiments of the present disclosure is applicable to light sources including ultraviolet illumination sources and light sources of other wavelength bands. Applicable illumination forms can include conventional illumination, annular illumination, quadrupole illumination, or other types of off-axis illumination forms. Applicable mask patterns can include dense lines with a single critical dimension or other complex patterns with non-dense lines. For other mask patterns, the exposure light source can be a linear superposition of two incoherent transverse magnetic (TM) and transverse electric (TE) polarized lights, and the imaging light field intensity in the photoresist layer is the sum of the imaging light field intensities of the two lights. The optical simulation model constructed in the illumination compensation method can be a two-dimensional exposure imaging model or a three-dimensional exposure imaging model. The two-dimensional exposure imaging model can be considered a special case of the three-dimensional exposure imaging model.

In order to verify the advantages of the illumination compensation method provided in the embodiments of the present disclosure, some specific examples and experimental data are provided below for explanation.

Example 1

The present example adopted a conventional illumination mode for illumination. The thickness of mask 1 of the exposure imaging system was 40 nm, the working gap was 20 nm, the thickness of the metal absorber layer 21 was 22 nm, the thickness of the metal reflective layer 23 was 40 nm, the thickness of the photoresist layer 22 was 18 nm, the wavelength of incident light was 365 nm, and the incident light was perpendicularly incident in the form of a transverse magnetic wave.

Figure 8:
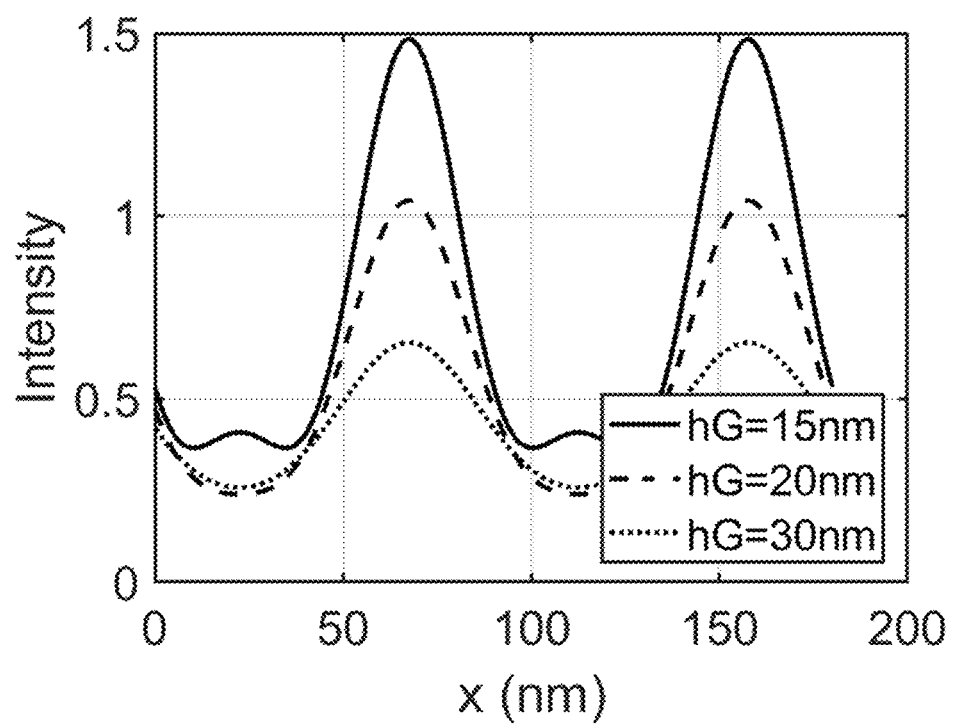
FIG. 8 schematically shows a curve graph of imaging light field intensity distribution in a photoresist layer before illumination compensation under normal incidence provided in Example 1.

FIG. 8 schematically shows a curve graph of imaging light field intensity distribution in a photoresist layer before illumination compensation under normal incidence provided in Example 1.

As shown in FIG. 8, the imaging light field intensity distribution curves corresponding to working gaps of 15 nm, 20 nm, and 30 nm are respectively provided. The x-axis coordinate indicates the position in the direction perpendicular to the dense lines in the plane of the exposure imaging system in FIG. 2, and the y-axis coordinate indicates the value of the imaging light field intensity in the photoresist.

Figure 9:
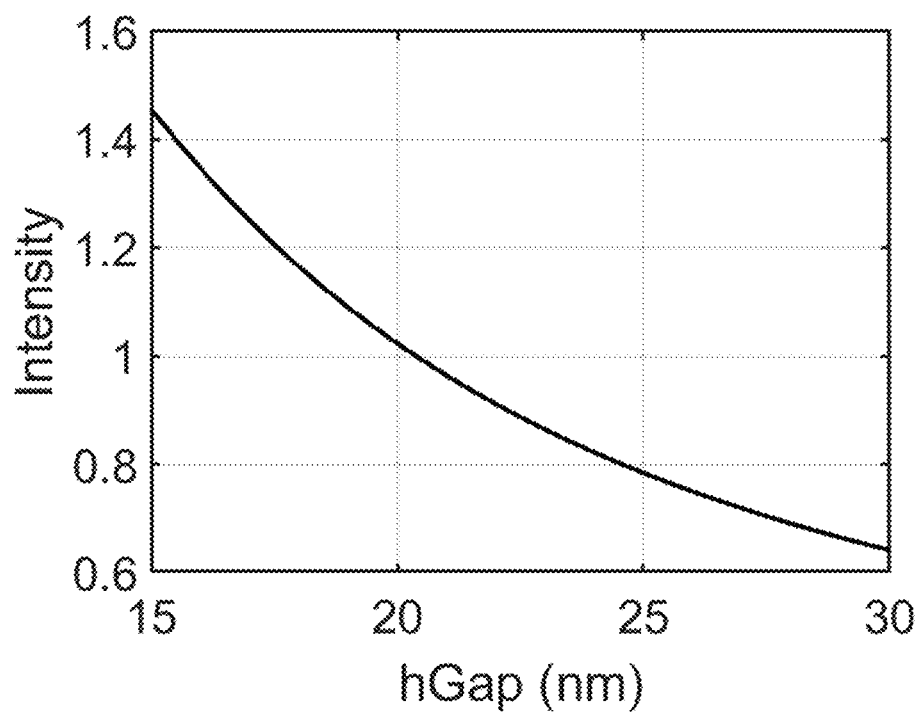
FIG. 9 schematically shows a curve graph of a maximum value of imaging light field intensity before illumination compensation under normal incidence varying with working gaps provided in Example 1.

FIG. 9 schematically shows a curve graph of a maximum value of imaging light field intensity before illumination compensation under normal incidence varying with working gaps provided in Example 1.

As shown in FIG. 9, the maximum value of imaging light field intensity before illumination compensation is the peak value of the curves in FIG. 8. The maximum value of the imaging light field intensity is different under different working gaps (hGap). The smaller the working gap is, the greater the maximum value of the imaging light field intensity is.

Figure 10:
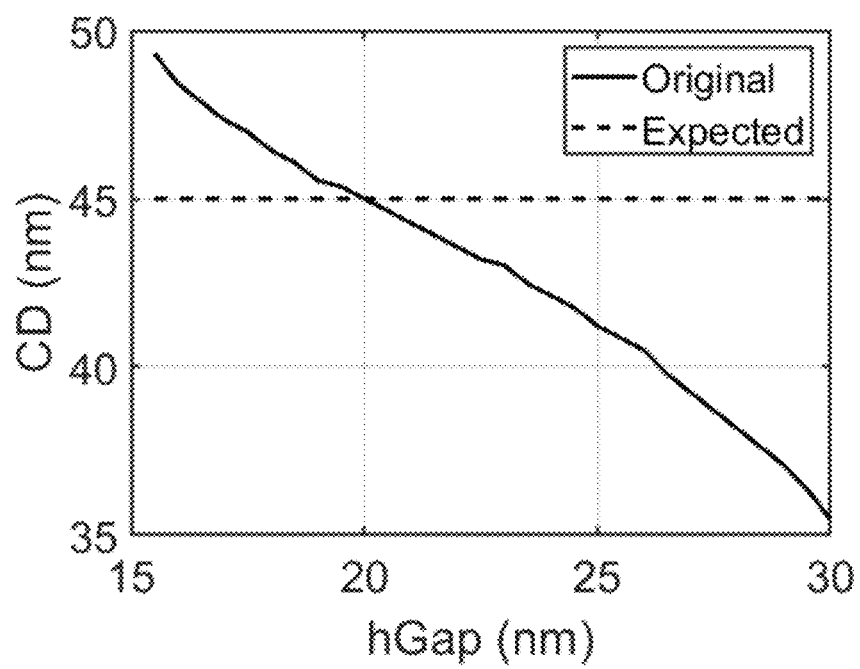
FIG. 10 schematically shows a curve graph of an original critical dimension and an expected critical dimension of imaged patterns under normal incidence varying with working gaps provided in Example 1.

FIG. 10 schematically shows a curve graph of an original critical dimension and an expected critical dimension of imaged patterns under normal incidence varying with the working gap provided in Example 1.

As shown in FIG. 10, the dashed line is the curve of the expected critical dimension (or referred to as critical dimension, CD) of the imaged pattern varying with the working gap, which is parallel to the x-axis, indicating that the expected critical dimension of the imaged pattern needs to be uniform. The solid line is the curve of the original critical dimension of the imaged pattern varying with the working gap. Within 6 nm around the central working gap of 20 nm, that is, when the working gap changes from 17 nm to 23 nm, the critical dimension of the imaged pattern changes from 47.2 nm to 42.7 nm, and the CDU value is ±5.1%.

Figure 11:
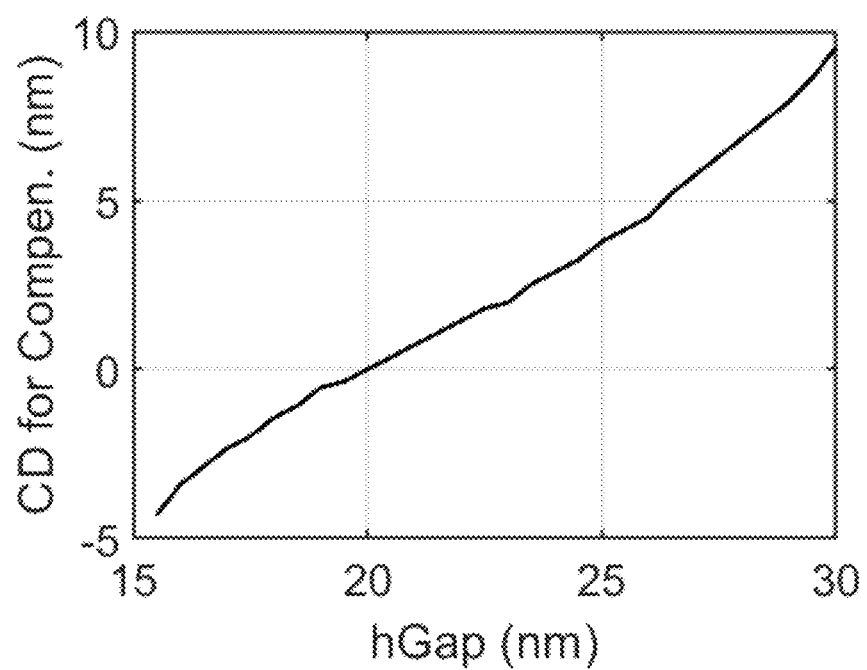
FIG. 11 schematically shows a curve graph of a critical dimension of an imaged pattern that needs to be compensated under different working gaps under normal incidence provided in Example 1.

FIG. 11 schematically shows a curve graph of a critical dimension of an imaged pattern that needs to be compensated under different working gaps under normal incidence provided in Example 1.

By comparing FIG. 11 with FIG. 10, it can be seen that the curve of change of the critical dimension of the imaged pattern that needs to be compensated and the curve of the original critical dimension of the imaged pattern varying with the working gap form a complementary relationship, so that the compensated critical dimension of the imaged pattern matches the expected critical dimension of the imaged pattern.

Figure 12:
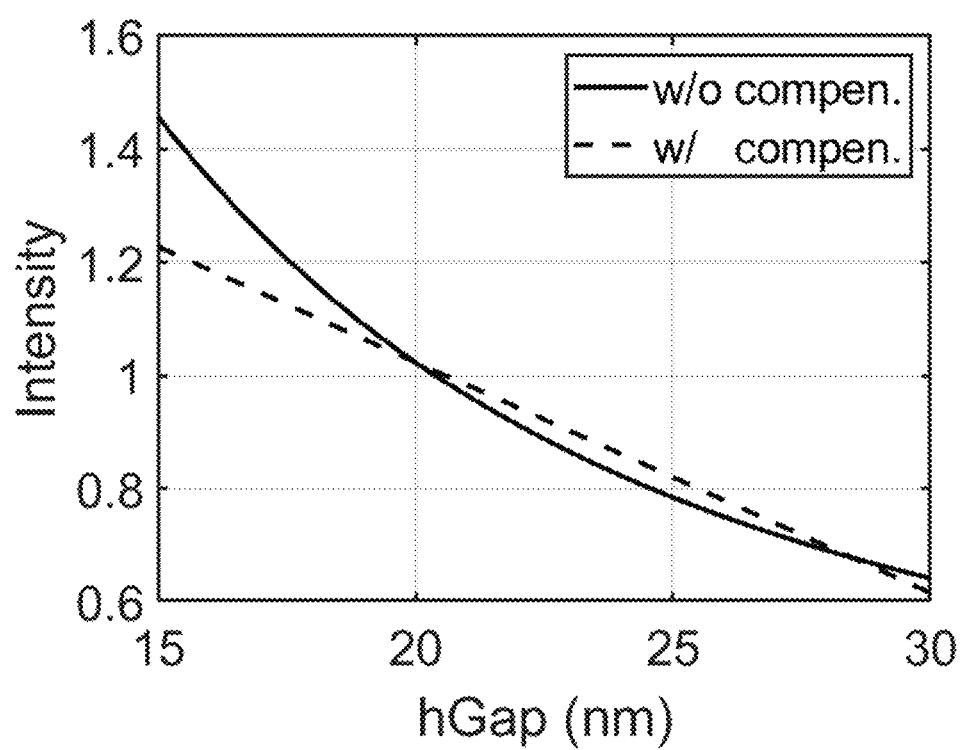
FIG. 12 schematically shows a curve graph of a maximum value of imaging light field intensity varying with working gaps before and after illumination compensation under normal incidence provided in Example 1.

FIG. 12 schematically shows a curve graph of a maximum value of imaging light field intensity varying with working gaps before and after illumination compensation under normal incidence provided in Example 1.

As shown in FIG. 12, after illumination compensation, the maximum value of imaging light field intensity under a smaller working gap (15 nm) is reduced to some extent, and the maximum value of light field intensity under a middle working gap (20 nm to 25 nm) increases slightly. From the trend of the curve, the variation of the maximum value of imaging light field intensity with the working gap after illumination compensation is more gradual. When obtaining the compensation information, the undulation of the surface of the substrate corresponds to the variation of the working gaps, wherein a protrusion on the substrate corresponds to a working gap smaller than the central working gap, and a recess on the substrate corresponds to a working gap greater than the central working gap.

Figure 13:
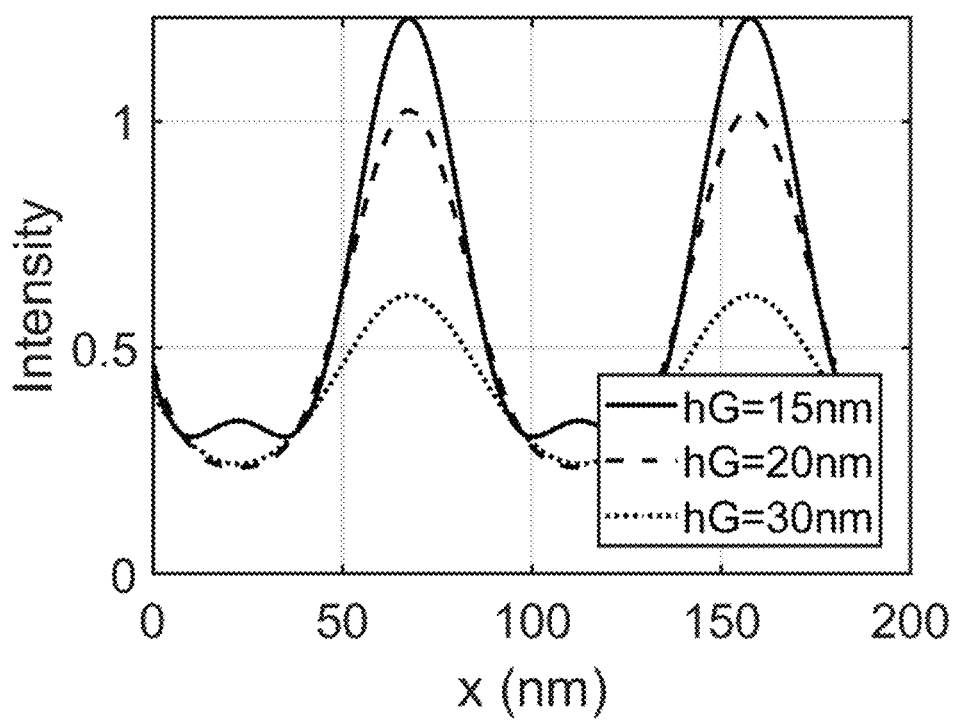
FIG. 13 schematically shows a curve graph of imaging light field intensity distributions in a photoresist layer after illumination compensation under normal incidence provided in Example 1.

FIG. 13 schematically shows a curve graph of imaging light field intensity distributions in a photoresist layer after illumination compensation under normal incidence provided in Example 1.

As shown in FIG. 13, similarly to FIG. 8, the imaging light field intensity distribution curves corresponding to working gaps of 15 nm, 20 nm, and 30 nm are respectively provided.

Figure 14:
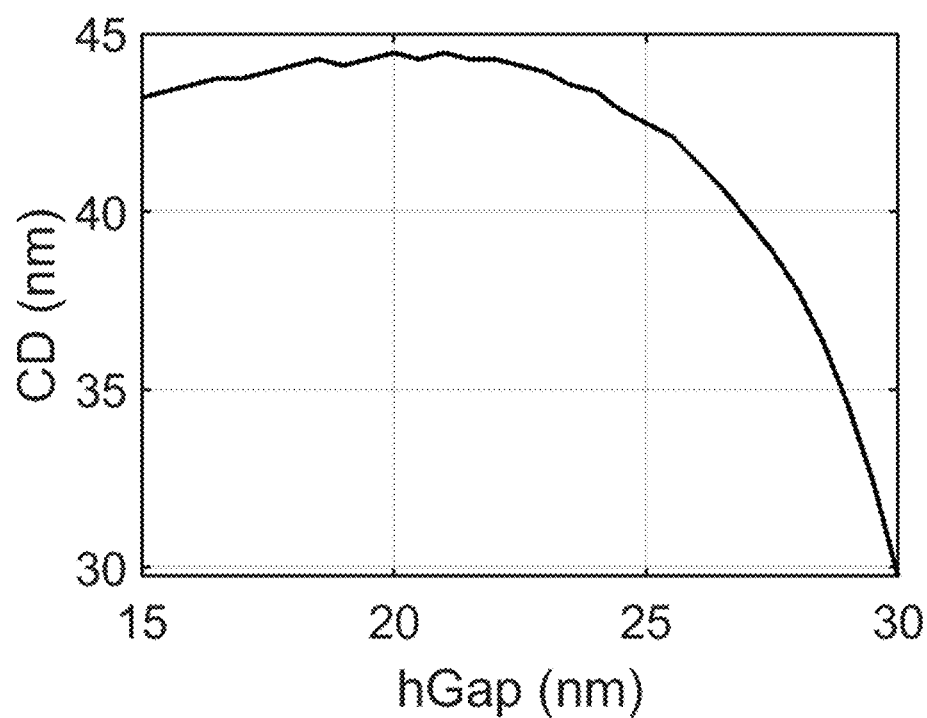
FIG. 14 schematically shows a curve graph of a critical dimension of an imaged pattern varying with working gaps after illumination compensation under normal incidence provided in Example 1.

FIG. 14 schematically shows a curve graph of a critical dimension of an imaged pattern varying with working gaps after illumination compensation under normal incidence provided in Example 1.

As shown in FIG. 14, within 6 nm around the central working gap, the value of the critical dimension of the imaged pattern changes from 44.5 nm to 45 nm, and the CDU value is ±0.6%. Compared with FIG. 10, the curve changes more gradually around the central working gap. By comparing the CDU values before and after compensation, it is found that illumination compensation can significantly reduce the CDU value. The CDU value after illumination compensation is only 11.76% of that before illumination compensation, and the effect of illumination compensation is significant.

Example 2

In this example, an off-axis illumination mode was adopted for illumination. The thickness of mask 1 of the exposure imaging system was 40 nm, the working gap was 40 nm, the thickness of the metal absorber layer 21 was 16 nm, the thickness of the metal reflective layer 23 was 28 nm, the thickness of the photoresist layer 22 was 50 nm, the wavelength of incident light was 365 nm, and the incident light was in the form of transverse magnetic waves obliquely incident from both sides at angles of 72.4 degrees and −72.4 degrees, respectively.

Figure 15:
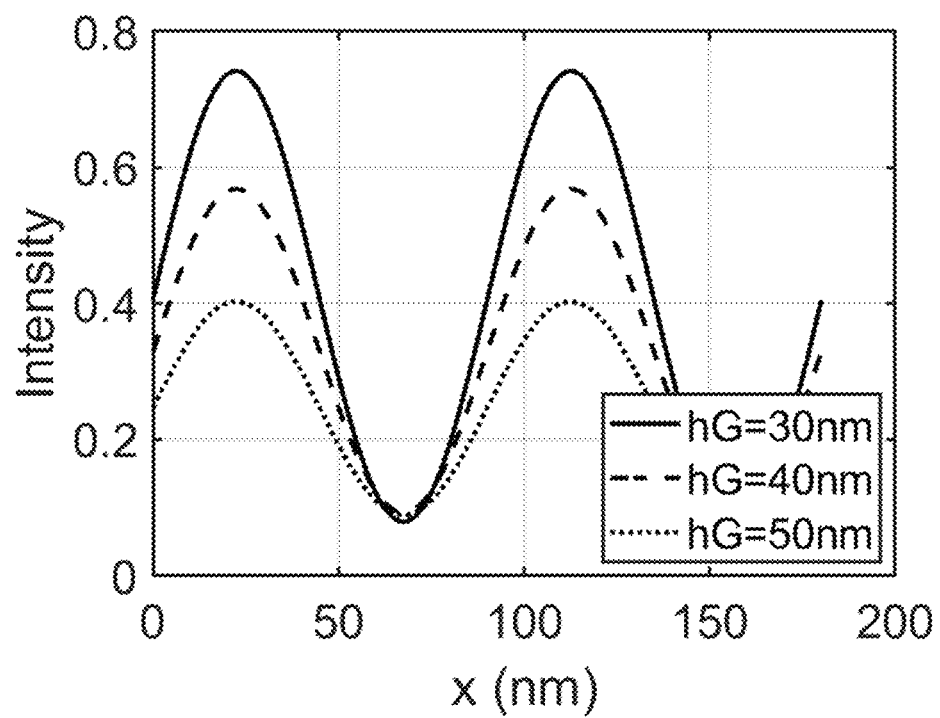
FIG. 15 schematically shows a curve graph of imaging light field intensity distributions in a photoresist layer before illumination compensation under oblique incidence provided in Example 2.

FIG. 15 schematically shows a curve graph of imaging light field intensity distributions in a photoresist layer before illumination compensation under oblique incidence provided in Example 2.

As shown in FIG. 15, the light field intensity distribution curves corresponding to working gaps of 30 nm, 40 nm, and 50 nm are respectively provided. Similarly, the x-axis coordinate indicates the position in the direction perpendicular to the dense lines in the plane of the exposure imaging system in FIG. 2, and the y-axis coordinate indicates the value of the imaging light field intensity in the photoresist.

Figure 16:
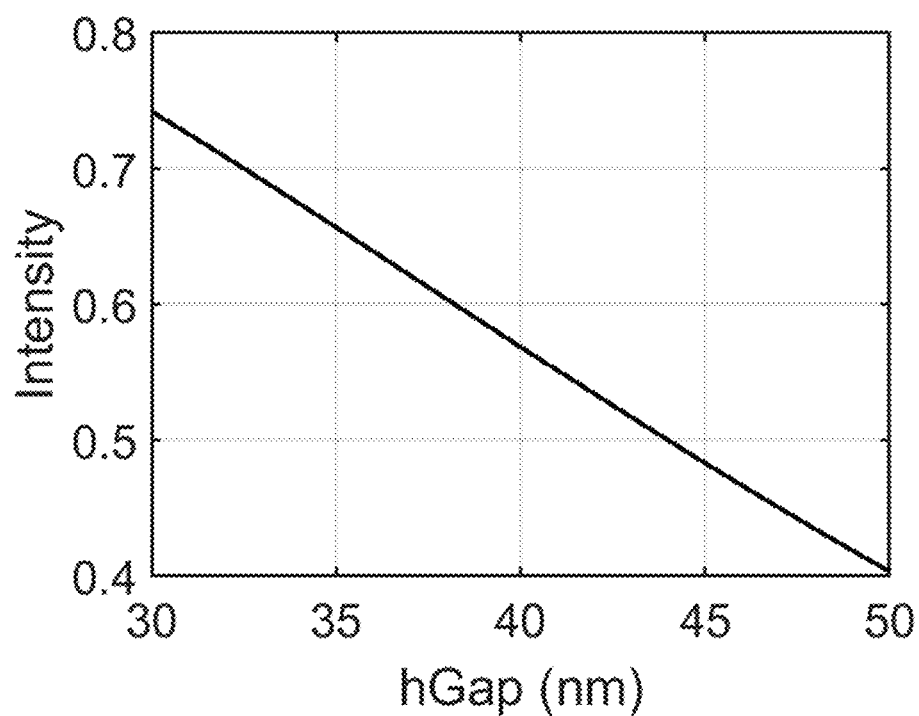
FIG. 16 schematically shows a curve graph of a maximum value of imaging light field intensity varying with working gaps before illumination compensation under oblique incidence provided in Example 2.

FIG. 16 schematically shows a curve graph of a maximum value of imaging light field intensity varying with working gaps before illumination compensation under oblique incidence provided in Example 2.

As shown in FIG. 16, the maximum value of imaging light field intensity before illumination compensation is the peak value of the curves in FIG. 15. The maximum value of the imaging light field intensity is different under different working gaps (hGap). The smaller the working gap is, the greater the maximum value of the light field intensity is.

Figure 17:
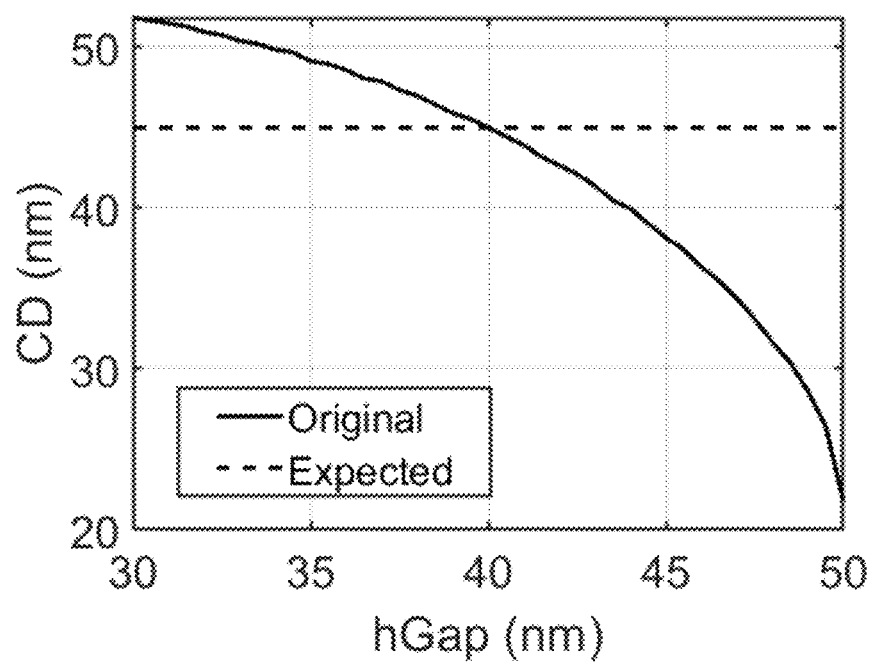
FIG. 17 schematically shows a curve graph of an original critical dimension and an expected critical dimension of an imaged pattern varying with working gaps under oblique incidence provided in Example 2.

FIG. 17 schematically shows a curve graph of an original critical dimension and an expected critical dimension of an imaged pattern varying with working gaps under oblique incidence provided in Example 2.

As shown in FIG. 17, the dashed line is the curve of the expected critical dimension (or referred to as critical dimension, CD) of the imaged pattern varying with the working gap, which is parallel to the x-axis, indicating that the expected critical dimension of the imaged pattern needs to be uniform. The solid line is the curve of the original critical dimension of the imaged pattern varying with the working gap. The central working gap is 40 nm, and within 20 nm around the central working gap, that is, when the working gap changes from 30 nm to 50 nm, the critical dimension of the imaged pattern changes from 51.5 nm to 21.8 nm, and the CDU value is ±33.3%.

Figure 18:
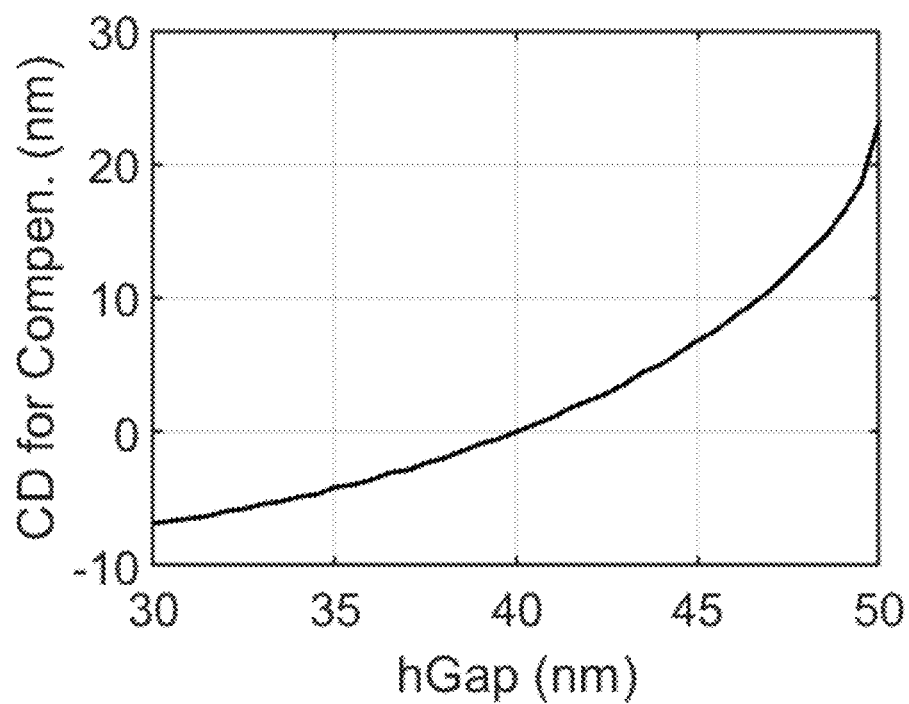
FIG. 18 schematically shows a curve graph of a critical dimension of an imaged pattern that needs to be compensated under different working gaps under oblique incidence provided in Example 2.

FIG. 18 schematically shows a curve graph of a critical dimension of an imaged pattern that needs to be compensated under different working gaps under oblique incidence provided in Example 2.

By comparing FIG. 18 with FIG. 17, it can be seen that the curve of change of the critical dimension of the imaged pattern needs to be compensated and the curve of the original critical dimension of the imaged pattern varying with the working gap form a complementary relationship, so that the compensated critical dimension of the imaged pattern matches the expected critical dimension of the imaged pattern.

Figure 19:
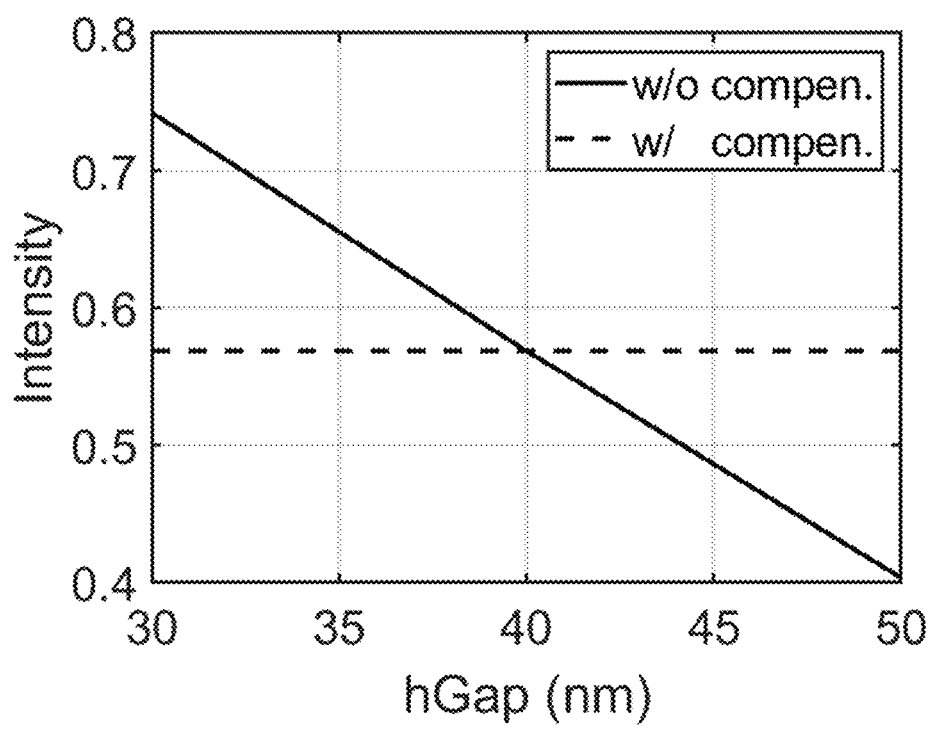
FIG. 19 schematically shows a curve graph of a maximum value of imaging light field intensity varying with working gaps before and after illumination compensation under oblique incidence provided in Example 2.

FIG. 19 schematically shows a curve graph of a maximum value of imaging light field intensity varying with working gaps before and after illumination compensation under oblique incidence provided in Example 2.

As shown in FIG. 19, after illumination compensation, the maximum value of imaging light field intensity under a smaller working gap (30 nm to 40 nm) is reduced to some extent, and the maximum value of light field intensity under a middle working gap (40 nm to 50 nm) increases slightly. From the trend of the curve, the variation of the maximum value of light field intensity with the working gap after illumination compensation is more gradual. When obtaining the compensation information, the undulation of the surface of the substrate corresponds to the variation of the working gap, wherein a protrusion on the substrate corresponds to a working gap smaller than the central working gap, and a recess on the substrate corresponds to a working gap greater than the central working gap.

Figure 20:
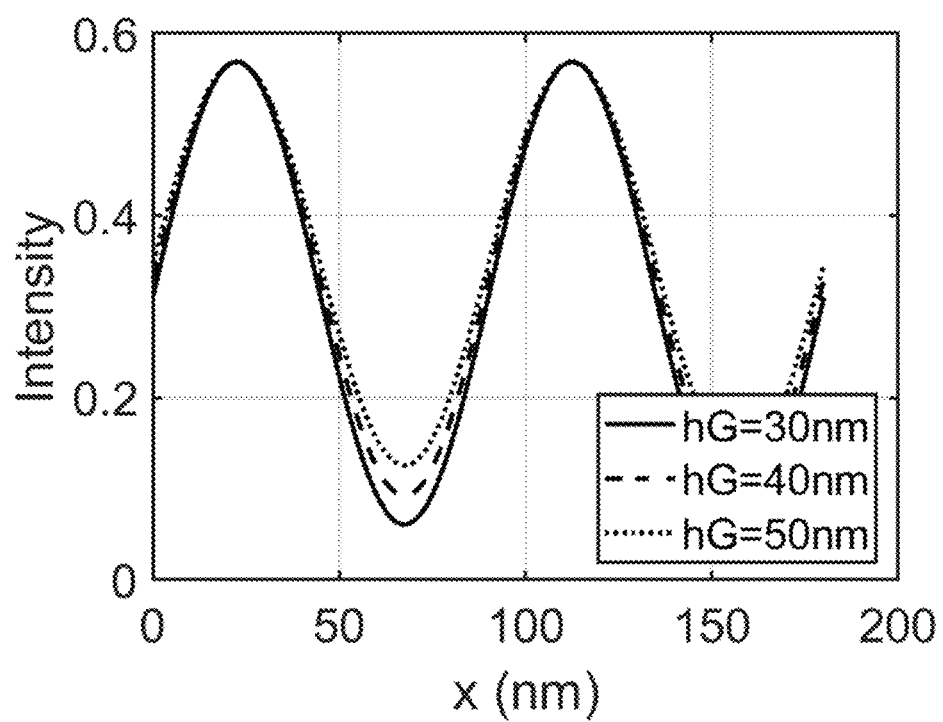
FIG. 20 schematically shows a curve graph of an imaging light field intensity distribution in a photoresist layer after illumination compensation under oblique incidence provided in Example 2.

FIG. 20 schematically shows a curve graph of an imaging light field intensity distribution in a photoresist layer after illumination compensation under oblique incidence provided in Example 2.

As shown in FIG. 20, similarly to FIG. 15, the imaging light field intensity distribution curves corresponding to working gaps of 30 nm, 40 nm, and 50 nm are respectively provided.

Figure 21:
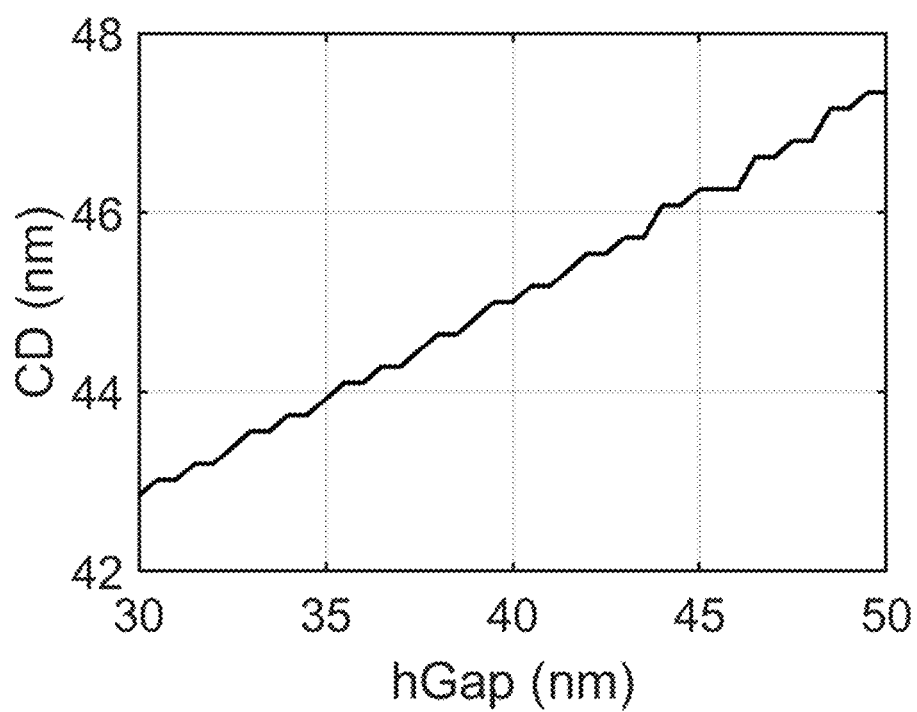
FIG. 21 schematically shows a curve graph of a critical dimension of an imaged pattern varying with working gaps after illumination compensation under oblique incidence provided in an embodiment of the present disclosure.

FIG. 21 schematically shows a curve graph of a critical dimension of an imaged pattern varying with working gaps after illumination compensation under oblique incidence provided in an embodiment of the present disclosure.

As shown in FIG. 21, within 20 nm around the central working gap, the value of the critical dimension of the imaged pattern changes from 42.5 nm to 47.2 nm, and the CDU value is ±6.3%. Compared with FIG. 17, the curve changes more gradually around the central working gap. By comparing the CDU values before and after compensation, it is found that illumination compensation can significantly reduce the CDU value. The CDU value after illumination compensation is only 18.92% of that before illumination compensation, and the effect of illumination compensation is significant.

In summary, the illumination compensation method provided in the present disclosure is capable of compensating for the non-uniformity of the critical dimension of the imaged pattern caused by different working gaps, namely, the critical dimension non-uniformity. Illumination compensation performed based on the measurement of the working gap distribution can reduce or eliminate the critical dimension non-uniformity of the exposed pattern of the photoresist, which is caused by different working gaps. Accordingly, the critical dimension uniformity for large-area exposure of patterns with single critical dimension or critical dimension requirements for cross-scale patterns is achieved to meet the pattern exposure requirements.

The above specific embodiments further describe the objectives, technical solutions, and beneficial effects of the present disclosure in detail. It should be understood that the above description is merely a specific embodiment of the present disclosure and is not intended to limit the present disclosure. Any modifications, equivalent substitutions, improvements, etc., made within the spirit and principle of the present disclosure shall be included within the scope of protection of the present disclosure.

The invention claimed is:

1. An illumination compensation method, comprising:
   acquiring working gaps between an imaging film stack and a mask in an exposure imaging system;
   calculating an imaging light field intensity of the photoresist layer in the imaging film stack corresponding to different working gaps; constructing a functional dependence of imaged pattern critical dimension in the photoresist layer of the imaging film stack on the working gap based on said imaging light field intensity critical dimension;
   calculating compensation parameters required for illumination light according to the said functional dependence of imaged pattern critical dimension on working gap; and
   performing illumination compensation on the exposure imaging system according to the compensation parameters,
   wherein the step of calculating the imaging light field intensity of the photoresist layer in the imaging film stack corresponding to different working gaps comprises:
   establishing an optical simulation model from the illumination light to the imaging light field in the photoresist layer, wherein the optical simulation model comprises a projection lens group simulation model modeling light propagation from the illumination light to the incident light on the upper surface of the mask, and an imaging film stack optical simulation model modeling light propagation from the on the upper surface of the mask to the imaging light field in the photoresist layer; and
   calculating the imaging light field intensity of the photoresist layer corresponding to varied working gaps under given mask patterns and illumination light distribution based on the optical simulation model,
   wherein the step of constructing a functional dependence of imaged pattern critical dimension in the photoresist layer of the imaging film stack on the working gap based on said imaging light field intensity comprises:
   applying a threshold to the imaging light field intensity of the photoresist layer corresponding to each working gap, to obtain the critical dimension of the imaged pattern of the photoresist layer corresponding to the working gap; and
   constructing the relationship between the critical dimension of the imaged pattern of the photoresist layer and the working gap based on a critical dimension of the imaged pattern corresponding to each working gap,
   wherein the step of calculating compensation parameters required for illumination light according to the said functional dependence of imaged pattern critical dimension on working gap comprises:
   according to the relationship between the original critical dimension of the imaged pattern and the working gap, and the relationship between the expected critical dimension of the imaged pattern and the working gap, calculating the critical dimension of the imaged pattern of the photoresist layer that needs to be compensated under different working gaps; and
   converting the critical dimension of the imaged pattern of the photoresist layer that needs to be compensated into corresponding imaging light field intensity, substituting the corresponding imaging light field intensity into the optical simulation model, and calculating compensation parameters, wherein the compensation parameters include light intensity, polarization state, and phase.

2. The illumination compensation method according to claim 1, wherein the step of acquiring the working gaps between the imaging film stack and the mask in the exposure imaging system specifically comprises:
   measuring undulation profile of the surface of the imaging film stack; and
   determining the working gap between the imaging film stack and the mask according to the undulation profile.

3. The illumination compensation method according to claim 1, wherein the optical simulation model is:

$$I_{Pr}(x, y) = I_{ill}(x, y) \otimes PSF_{lens} \otimes \text{Mask}(x, y) \otimes PSF_{near-field},$$

where $I_{Pr}(x,y)$ is the imaging light field intensity distribution in the photoresist layer, $I_{ill}(x,y)$ is the corresponding parameter distribution of the illumination light, $PSF_{lens}$ and $PSF_{near-filed}$ are the optical point spread functions of the projection lens group simulation model and the imaging film stack optical simulation model respectively, and $\text{Mask}(x,y)$ is the mask pattern distribution.

4. The illumination compensation method according to claim 1, wherein the optical simulation model is constructed using a finite-difference time-domain (FDTD) method, a rigorous coupled wave analysis (RCWA) method, or a finite element method (FEM).

5. The illumination compensation method according to claim 1, wherein the step of performing illumination compensation on the exposure imaging system according to the compensation parameters comprises:
   constructing an illumination compensation system using light field modulation technology according to the compensation parameters; and
   performing pixelation adjustment on the incident light field of the exposure imaging system using the illumination compensation system.

6. The illumination compensation method according to claim 1, wherein the illumination compensation method further comprises:
   respectively calculating the uniformity evaluation index of the critical dimension of the imaged pattern of the photoresist layer before and after illumination compensation;
   determining whether the uniformity evaluation index of the critical dimension of the imaged pattern of the photoresist layer after compensation is superior to the uniformity evaluation index of critical dimension of the imaged pattern of the photoresist layer before compensation; and determining that the illumination compensation is effective when the uniformity evaluation index after compensation is superior to the uniformity evaluation index before compensation.

7. The illumination compensation method according to claim 6, wherein the uniformity evaluation index of the critical dimension of the imaged pattern of the photoresist layer comprises:

determining a central working gap; and taking the uniformity values of the critical dimension of the imaged pattern of the photoresist layer when the working gap varies around the central working gap as the uniformity evaluation index.

* * * * *